United States Patent
Sutardja

(10) Patent No.: US 7,161,342 B2
(45) Date of Patent: Jan. 9, 2007

(54) LOW LOSS DC/DC CONVERTER

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 10/621,058

(22) Filed: Jul. 15, 2003

(65) Prior Publication Data

US 2004/0080302 A1 Apr. 29, 2004

Related U.S. Application Data

(60) Provisional application No. 60/421,447, filed on Oct. 25, 2002.

(51) Int. Cl.
*H02M 3/155* (2006.01)

(52) U.S. Cl. .................. 323/351; 323/271; 323/288
(58) Field of Classification Search ............... 323/224, 323/271, 288, 351
See application file for complete search history.

(56) References Cited

U.S. PATENT DOCUMENTS

| | | | | |
|---|---|---|---|---|
| 4,430,609 A | * | 2/1984 | Van Kessel et al. ......... | 323/350 |
| 5,010,261 A | | 4/1991 | Steigerwald ................. | 307/571 |
| 5,276,603 A | | 1/1994 | Stanley ......................... | 363/43 |
| 5,583,460 A | | 12/1996 | Dohi et al. ................... | 327/126 |
| 5,610,807 A | | 3/1997 | Kanda et al. ................. | 363/43 |
| 5,687,067 A | | 11/1997 | Majid et al. .................. | 363/97 |
| 6,430,066 B1 | | 8/2002 | Emori et al. ................. | 363/43 |
| 6,462,962 B1 | | 10/2002 | Cuk .............................. | 363/16 |
| 6,489,756 B1 | | 12/2002 | Kanouda et al. ............. | 323/284 |
| 2002/0080631 A1 | | 6/2002 | Kanouda et al. ............. | 363/62 |

FOREIGN PATENT DOCUMENTS

| | | |
|---|---|---|
| JP | 02-237220 | 9/1990 |
| JP | 04-172962 | 6/1992 |
| JP | 5-68130 | 9/1993 |
| JP | 6006195 | 1/1994 |
| JP | 08-182305 | 7/1995 |
| JP | 10-023743 | 1/1998 |
| JP | 10-075164 | 3/1998 |
| JP | 2001-352748 | 12/2001 |
| JP | 2002-199708 | 7/2002 |

OTHER PUBLICATIONS

Scott Deury, "Optimizing Transistor Performance in Synchronous Rectifier, Duck Converters", IEEE, Mar. 2000.
English Translation of Japanese Office Action for Japanese Patent Application No. 2003–362674 (corresponding to US 10/621,058); Examiner Sakurada; Office Action Applying Article 29(2); Agent Akihiro Ryuka; Jun. 7, 2005; Document to be published by USPTO.

* cited by examiner

*Primary Examiner*—Jeffrey Sterrett

(57) ABSTRACT

A direct current to direct current converter includes first and second switches to output voltages on first and second output terminals in response to appropriate turn-on voltages at first and second control terminals. The first control terminal may selectively communicate with one of N>2 different voltages. The converter may include a first multi-level controller in communication with the first control terminal, the controller including N drivers to selectively apply the N>2 different voltages to the first control terminal.

90 Claims, 7 Drawing Sheets

US 7,161,342 B2

LOW LOSS DC/DC CONVERTER

CROSS-REFERENCE TO RELATED APPLICATIONS

The present application claims priority to commonly assigned U.S. Provisional Patent Application No. 60/421,447, entitled "LOW LOSS DC/DC CONVERTER," filed on Oct. 25, 2002, which is hereby incorporated by reference in its entirety.

TECHNICAL FIELD

This invention relates to direct current to direct current (DC/DC) converters.

BACKGROUND

In some applications, DC/DC converters may be operated using high switching frequencies. For example, in order to meet response time requirements for particular loads, switching frequencies on the order of tens to hundreds of megahertz may be needed. However, with higher switching frequencies, the power dissipated as a result of the gate switching loss may increase to an unacceptable level.

FIG. 1 shows a DC/DC converter system 100 in a step-down configuration known as a "buck" configuration. A pulse width modulator (PWM) controller 110 controls a p-switch 120 and an n-switch 130, which are implemented using power transistors. A load 140 may be coupled with the output of p-switch 120 and n-switch 130 via an inductor 150 and a capacitor 160.

System 100 may dissipate power in a number of ways, each of which decreases the efficiency of the system. For example, resistive losses due to the on-state drain/source resistance (referred to as $R_{ds\text{-}on}$) reduce the efficiency of the system. In order to reduce power loss due to $R_{ds\text{-}on}$, larger transistors may be used.

However, larger transistors exhibit increased capacitance between the gate and the source, $C_{gs}$. This in turn increases what is termed the gate loss of the transistor. For a voltage V being switched at a frequency f across a capacitance $C_{gs}$, the gate loss is given by Equation (1) below:

$$\text{Gate loss} = \tfrac{1}{2} C_{gs} V^2 f \qquad \text{Equation (1)}$$

At relatively low frequencies (for example, frequencies on the order of about 100 kHz), the gate loss may be significantly less than $R_{ds\text{-}on}$. However, as higher switching frequencies are used, gate loss may make a substantial contribution to the power dissipation in system 100.

SUMMARY

In general, in one aspect, a direct current to direct current converter includes a first switch to output a first voltage on a first output terminal in response to a turn-on voltage at a first control terminal. The converter may also include a second switch to output a second voltage on a second output terminal in communication with the first output terminal in response to a turn-on voltage at a second control terminal.

The first control terminal may selectively communicate with one of N>2 different voltages. The second control terminal may selectively communicate with one of M>2 different voltages.

The first switch and the second switch may comprise, for example, first and second transistors, where the first and second output terminals comprise associated drains of the first and second transistors, and where the first and second control terminals comprise associated gates of the first and second transistors.

The converter may also include a first multi-level controller in communication with the first control terminal. The first multi-level controller may include N>2 drivers, where each of the n=1 to n=N drivers is to selectively apply a different voltage $V_n$ to the first control terminal. The N drivers may be to selectively apply the different voltage for a time sufficient for the voltage at the first control terminal to substantially equilibrate with the different voltage.

The converter may also include a second multi-level controller in communication with the second control terminal. The second multi-level controller may include M>2 drivers, where each of the m=1 to m=N drivers is to selectively apply a different voltage $V_m$ to the second control terminal. The first and second multi-level controllers may be to turn on the first switch and the second switch alternately. The first output terminal and the second output terminal may be in communication with a load; for example, via an inductor and a capacitor.

In general, in another aspect, a direct current to direct current converter includes an integrated circuit. The integrated circuit includes a first switch to output a first voltage on a first output terminal in response to a turn-on voltage at a first control terminal. The integrated circuit may also include a second switch to output a second voltage on a second output terminal in communication with the first output terminal in response to a turn-on voltage at a second control terminal.

The integrated circuit may also include a first multi-level controller in communication with the first control terminal. The first multi-level controller may include N>2 drivers, where each of the n=1 to n=N drivers is to selectively apply a different voltage $V_n$ to the first control terminal. At least one of the N drivers may comprise an associated capacitance.

The converter may also include a capacitor separate from the integrated circuit, where the capacitance of the capacitor is included in the associated capacitance of one of the N drivers. The capacitor may be one of P capacitors, where a capacitance of each of the P capacitors is included in the associated capacitance of at least one of the N drivers.

The integrated circuit may also include a second multi-level controller in communication with the second control terminal. The second multi-level controller may include M>2 drivers, where each of the m=1 to m=N drivers is to selectively apply a different voltage $V_m$ to the second control terminal.

In general, in one aspect, a direct current to direct current converter may comprise a first switching assembly including I switches to output a voltage on an associated output terminal in response to a turn-on voltage at an associated control terminal, each of the associated output terminals in communication with a first switching assembly output terminal configured to output a voltage to a load. One or more of the I switches may include an associated multi-level controller in communication with an associated control terminal. An i-th one of the associated multi-level controllers may include N(i) drivers, each of the n(i)=1 to n(i)=N(i) drivers to selectively apply a different voltage $V_{n(i)}$ to the associated control terminal, where N(i) is greater than two for at least one of the I switches.

The converter may further comprise a second switching assembly including J switches. Each of the J switches may be to output a voltage on an associated output terminal in response to a turn-on voltage at an associated control terminal. Each of the associated output terminals may be in communication with a second switching assembly output terminal. The second switching assembly output terminal may be in communication with the first switching assembly output terminal.

One or more of the J switches may include an associated multi-level controller in communication with an associated control terminal. For example, a j-th one of the associated multi-level controllers may include N(j) drivers, each of the n(j)=1 to n(j)=N(j) drivers to selectively apply a different voltage $V_{n(j)}$ to the associated control terminal, where N(j) is greater than two for at least one of the J switches.

In general, in one aspect, a method may include alternately generating a first output voltage at an output of a first switching assembly including I switches and generating a second output voltage at an output of a second switching assembly including J switches. The output of the first switching assembly may be in communication with the output of the second switching assembly.

Generating the first output voltage may comprise turning on the first switching assembly, which may comprise selectively applying n(i)=1 to n(i)=N(i) different voltages $V_{n(i)}$ to an associated control terminal of an i-th one of the I switches. Selectively applying the different voltages $V_{n(i)}$ may comprise applying a voltage $V_{1(i)}$ at which the i-th switch is off, subsequently applying an intermediate voltage $V_{int(i)}$, and subsequently applying a voltage $V_{N(i)}$ at which the i-th switch is on, wherein $V_{int(i)}$ is between $V_{1(i)}$ and $V_{N(i)}$.

Generating the second output voltage may comprise turning on the second switching assembly. Turning on the second switching assembly may comprise selectively applying m(j)=1 to m(j)=M(j) different voltages $V_{m(j)}$ to an associated control terminal of a j-th one of the J switches. Selectively applying the different voltages $V_{m(j)}$ may comprise applying a voltage $V_{1(j)}$ at which the j-th switch is off, subsequently applying an intermediate voltage $V_{int(j)}$, and subsequently applying a voltage $V_{M(j)}$ at which the j-th switch is on, wherein $V_{int(j)}$ is between $V_{1(j)}$ and $V_{M(j)}$.

The method may further comprise filtering the first output voltage and the second output voltage to produce a generally direct current voltage. The generally direct current voltage may be applied to a load.

Turning on the first switching assembly may comprise selectively applying a voltage $V_2$ in turn to a plurality of the I switches and applying a voltage $V_3$ to the plurality of the I switches. The method may include applying $V_2$ to at least one of the I switches and applying $V_3$ to a different one of the I switches at the same time.

In general, in one aspect, a direct current to direct current converter may comprise means for generating a first output voltage at a node of the direct current to direct current converter. The converter may further comprise means for generating a second output voltage alternately with the first output voltage at the node. The means for generating the first output voltage may comprise means for selectively applying n=1 to n=N(i) different voltages to a control terminal of an i-th one of I switches, wherein the different voltages include a voltage $V_{1i}$ at which the associated i-th switch is off, a voltage $V_{N(i)i}$ at which the associated i-th switch is on, and a voltage $V_{int(i)}$ between $V_{1i}$ and $V_{N(i)i}$.

In general, in one aspect, a direct current to direct current converter may include a first switching means for outputting a first voltage on a first output terminal means in response to a turn-on voltage at a first control terminal means. The converter may further include a second switching means for outputting a second voltage on a second output terminal means in communication with the first output terminal means in response to a turn-on voltage at a second control terminal means.

The first control terminal means may selectively communicate with one of N>2 voltages. The second control terminal means may selectively communicate with one of M>2 voltages.

The converter may further include a first multi-level controlling means for controlling the first switching means. The first multi-level controlling means may be in communication with the first control terminal means, and may include N driving means, each of the n=1 to n=N driving means for selectively applying a different voltage $V_n$ to the first control terminal means, where N is greater than two.

In general, in one aspect, a direct current to direct current converter may include an integrated circuit. The integrated circuit may include a first switching means for outputting a first voltage on a first output terminal means in response to a turn-on voltage at a first control terminal means. The integrated circuit may further include a second switching means for outputting a second voltage on a second output terminal means in communication with the first output terminal means in response to a turn-on voltage at a second control terminal means.

The integrated circuit may further include a first multi-level controlling means for controlling the first switching means. The first multi-level controlling means may be in communication with the first control terminal means, and may include N driving means, each of the n=1 to n=N driving means for selectively applying a different voltage $V_n$ to the first control terminal means, where N is greater than two. At least one of the N driving means may include an associated capacitance means.

The converter may further include a second capacitance means separate from the integrated circuit, a capacitance of the second capacitance means included in the associated capacitance of one of the N driving means.

In general, in one aspect, a direct current to direct current converter may include a first switching assembly means, the first switching assembly means including I switching means for outputting a voltage on an associated output terminal means in response to a turn-on voltage at an associated control terminal means. Each of the associated output terminal means may be in communication with a first switching assembly means output terminal means configured to output a voltage to a load. One or more of the I switching means may further include an associated multi-level controlling means for controlling the switching means, the associated multi-level controlling means in communication with an associated control terminal means. An i-th one of the associated multi-level controlling means may include N(i) driving means, each of the n(i)=1 to n(i)=N(i) driving means for selectively applying a different voltage $V_{n(i)}$ to the associated control terminal means, where N(i) is greater than two for at least one of the I switching means.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

A low loss DC/DC converter as described herein may provide significant benefits at increased switching frequencies. Output regulators such as DC/DC converters are described in U.S. patent application Ser. No. 10/460,825, filed Jun. 12, 2003, which is hereby incorporated by reference in its entirety.

Figure 1:
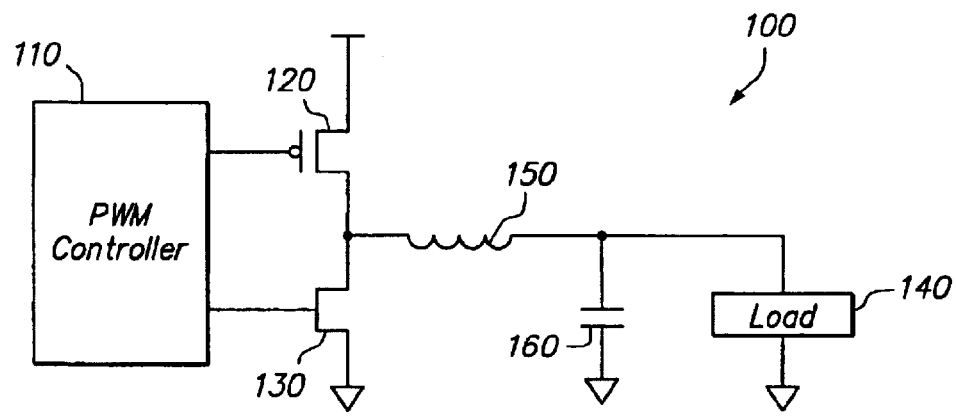
FIG. 1 is a schematic of a DC/DC converter according to the prior art.
Figure 2:
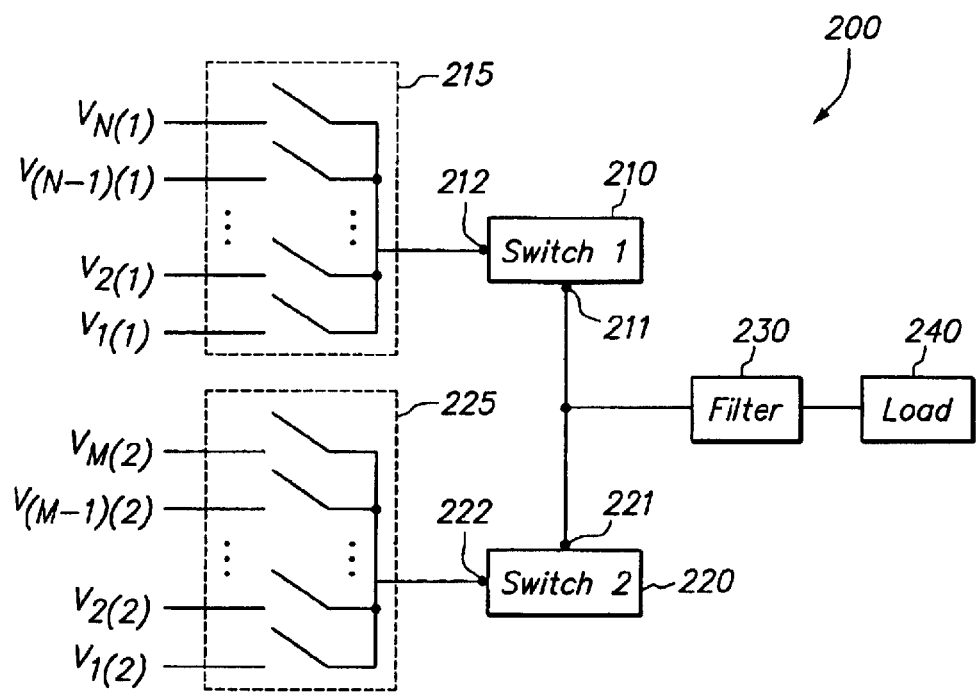
FIG. 2 is a schematic of an implementation of a DC/DC converter.

As noted above, a DC/DC converter may provide a generally DC voltage to a load by filtering the output of two switches that are turned on and off alternately. FIG. 2 shows a system 200 for low loss DC/DC conversion according to some implementations.

System 200 includes a first switch 210 and a second switch 220. First switch 210 may output a voltage on a first output terminal 211 in response to a turn-on voltage at a first control terminal 212. Similarly, second switch 220 may output a voltage on a second output terminal 221 in response to a turn-on voltage at a second control terminal 222. First switch 210 and second switch 220 may be turned on and off alternately, and their outputs filtered using a filter 230. The filtered, generally DC output may be provided to a load 240.

Rather than turning on first switch 210 and second switch 220 by switching a voltage at the associated control terminal directly from a voltage at which the switch is off to a voltage at which the switch is on, the associated control terminal may selectively communicate with one of a number of different voltages. That is, first switch 210 and second switch 220 may selectively communicate with a first voltage at which the associated switch is off, a second voltage at which the associated switch is on, and one or more intermediate voltages between the first voltage and the second voltage.

The associated control terminal may selectively communicate with the different voltages in a number of ways. For example, system 200 may include a multi-level connector 215 to selectively communicate the N different voltage levels with first control terminal 212. For first switch 210, $V_{1(1)}$ may be a voltage at which first switch 210 is off, while $V_{N(1)}$ may be a voltage at which first switch 210 is on. Rather than directly switching between $V_{1(1)}$ and $V_{1(N)}$, multi-level connecter 215 selectively communicates one or more intermediate voltages such as $V_{2(1)}$ and $V_{(N-1)(1)}$ with first control terminal 212. Similarly, a second multi-level connector 225 may selectively communicate M different voltage levels $V_{1(2)}$ through $V_{M(2)}$ with second control terminal 222 to turn on second switch 220.

First switch 210 and second switch 220 may be turned off in a similar manner. That is, the associated control terminal may selectively communicate with one of a number of different voltages, rather than being directly switched from a second voltage at which the associated switch is on to a first voltage at which the associated switch is off.

A DC/DC converter according to FIG. 2 may be more efficient than one in which the switches are turned on and off conventionally. In an illustrative example, first switch 210 and second switch 220 may be implemented as first and second transistors, and first control terminal 212 and second control terminal 222 may be associated gates of the transistors.

For first switch 210, $V_{1(1)}$ corresponds to a voltage at which the transistor is off, while $V_{N(1)}$ corresponds to a voltage at which the transistor is fully on. Similarly, for second switch 220, $V_{1(2)}$ corresponds to a voltage at which the transistor is off, while $V_{M(2)}$ corresponds to a voltage at which the transistor is fully on. The first and second transistors each have an associated gate source capacitance $C_{gs}$.

As noted above, a transistor switch operating at a frequency f may have an associated gate loss that depends on $C_{gs}$. According to Equation (1), if the gate voltage were switched directly between $V_{1(1)}$ and $V_{N(1)}$, the gate loss for the first switch would be equal to $$C_{gs}\frac{(V_{N(1)} - V_{1(1)})^2}{2}f.$$

Assuming N equally spaced voltage levels, for each of the (N−1) voltage changes, the gate loss per voltage change is shown in Equation (2):

$$\text{Gate loss}_{per\ level} = \frac{1}{2}C_{gs}\left(\frac{V_{N(1)} - V_{1(1)}}{N-1}\right)^2 f \qquad \text{Equation (2)}$$

Since there are N−1 steps, the net gate loss is given by Equation (3):

$$\text{Gate Loss}_{net} = C_{gs}\frac{(V_{N(1)} - V_{1(1)})^2}{2(N-1)}f \qquad \text{Equation (3)}$$

Thus, the theoretical net gate loss is 1/(N−1) times the loss obtained in a system switching directly between $V_{1(1)}$ and $V_{N(1)}$ (either turning on or turning off the first switch). The achieved improvement in gate loss may be less than the theoretical level. For example, if the gate voltage does not completely settle to an intermediate voltage level prior to switching to the next level, the actual improvement in gate loss may be less than the theoretical level.

As Equation (3) illustrates, using larger values of N may lead to greater improvements in the net gate loss. However, since stepping through the intermediate voltage levels takes a finite time, N is generally chosen as an appropriate value for improving gate loss and completing the switching within a reasonable time. In some implementations, N may be in the range from four to eight.

Figure 3A:
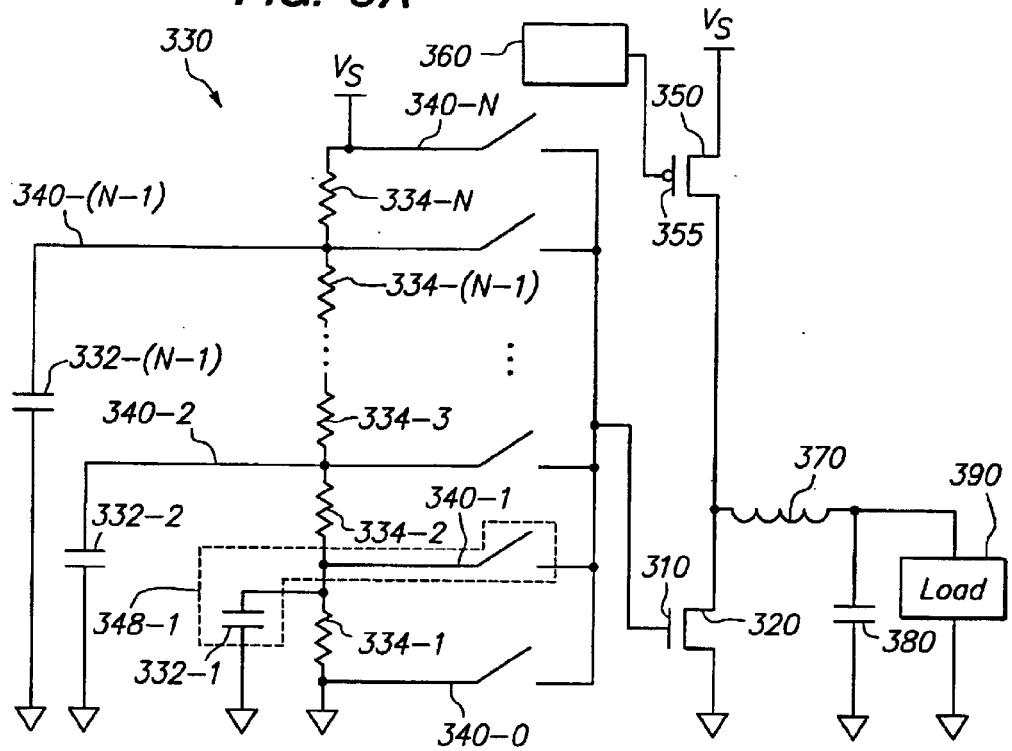
FIG. 3A is a schematic of another implementation of a DC/DC converter.

FIG. 3A shows a DC/DC conversion system 300 according to some implementations. A gate 310 of a first NMOS transistor 320 is in communication with a multi-level controller 330. Controller 330 selectively applies discrete voltage levels 340-0 through 340-N to gate 310. Multi-level controller 330 may include N+1 drivers such as driver 348-1. Driver 348-1 includes a capacitance 332-1 for charge storage and recycling, as well as a switching mechanism to selectively apply voltage level 340-1 to gate 310. Some of the N+1 drivers may include a switching mechanism to selectively apply an associate voltage to the gate but may not include an associated capacitor. The value of capacitance 332-1 may be chosen to provide sufficient charge storage and recycling capability. For a transistor with a gate-source capacitance $C_{gs}$, capacitance 332-1 is generally much greater than $C_{gs}$. System 300 may further include a second multi-level controller 360. Multi-level controller 360 may be in communication with a gate 355 of a second PMOS transistor 350. Multi-level controller 360 may include M drivers to selectively apply M different voltage levels to gate 355.

In some implementations, at least a portion of multi-level controller 330 may be included in an integrated circuit. However, since the capacitance used for charge storage and recycling is generally much greater than $C_{gs}$, including all of the capacitance on the integrated circuit may be difficult and expensive. Therefore, it may be beneficial to provide some charge storage capacity off-chip; that is, separate from an integrated circuit including other elements of multi-level controller 330.

First transistor 320 and second transistor 350 may be turned on alternately; that is, first transistor 320 may be turned on while second transistor 350 is off (or in some cases, barely on), and vice versa. A generally DC voltage may be provided to a load 390 by filtering the signal at the drain of first transistor 320 and second transistor 350 using an inductor 370 and a capacitor 380.

First transistor 320 may be turned on and off by switching a voltage at gate 310 between a first voltage 340-0 at which first transistor 320 is off and a second voltage 340-N at which first transistor 310 is on. However, rather than directly switching gate 310 of transistor 320 between first voltage 340-0 and second voltage 340-N (e.g., between 0 volts and 5 volts or 12 volts), gate 310 is switched between the first voltage and the second voltage via intermediate voltage levels 340-1 through 340-(N−1).

The different voltage levels 340-0 through 340-N may be provided using, for example, a voltage divider including resistors 334-1 through 334-N as shown. Note that resistors 334-1 through 334-N should be large so that minimal power is dissipated in the voltage divider. In some implementations, resistors 334-1 through 334-N may be substantially the same, so that the voltage levels are equally spaced. In other implementations, at least one of the resistors 334-1 through 334-N may be different from one or more of the other resistors.

Note that the voltage divider shown in FIG. 3A is only one of many alternatives for providing different voltage levels. Other configurations may be used. For example, voltage sources utilizing op-amps, digital to analog (D/A) converters, or current sources may be used.

Figure 3B:
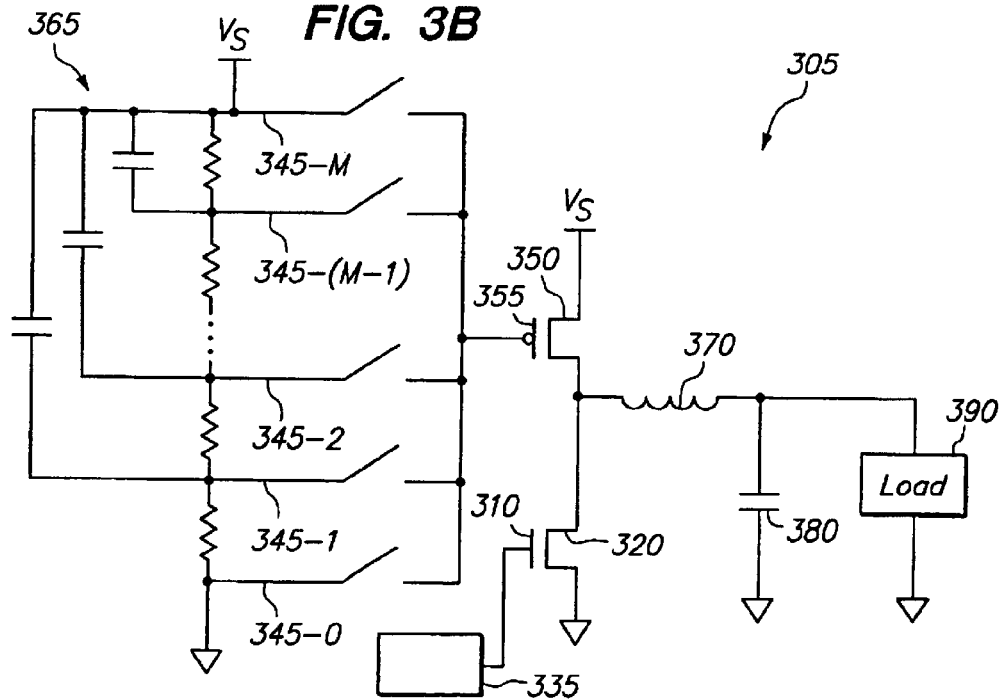
FIG. 3B is a schematic of another implementation of a DC/DC converter.

FIG. 3B shows a system 305, according to an implementation where a second transistor 350 is implemented as a PMOS transistor. A gate 355 of second transistor 350 is in communication with a multi-level controller 365. Controller 365 selectively applies discrete voltage levels 345-0 through 345-M to gate 355. In system 305, a first transistor 320 is implemented as an NMOS transistor, with a controller 335 in communication with a gate 310 of first transistor 320. As with the implementation of FIG. 3A, the different voltage levels 345-0 through 345-M may be provided using a resistive voltage divider, while capacitive charge storage and recycling may be provided using capacitors.

Figure 4:
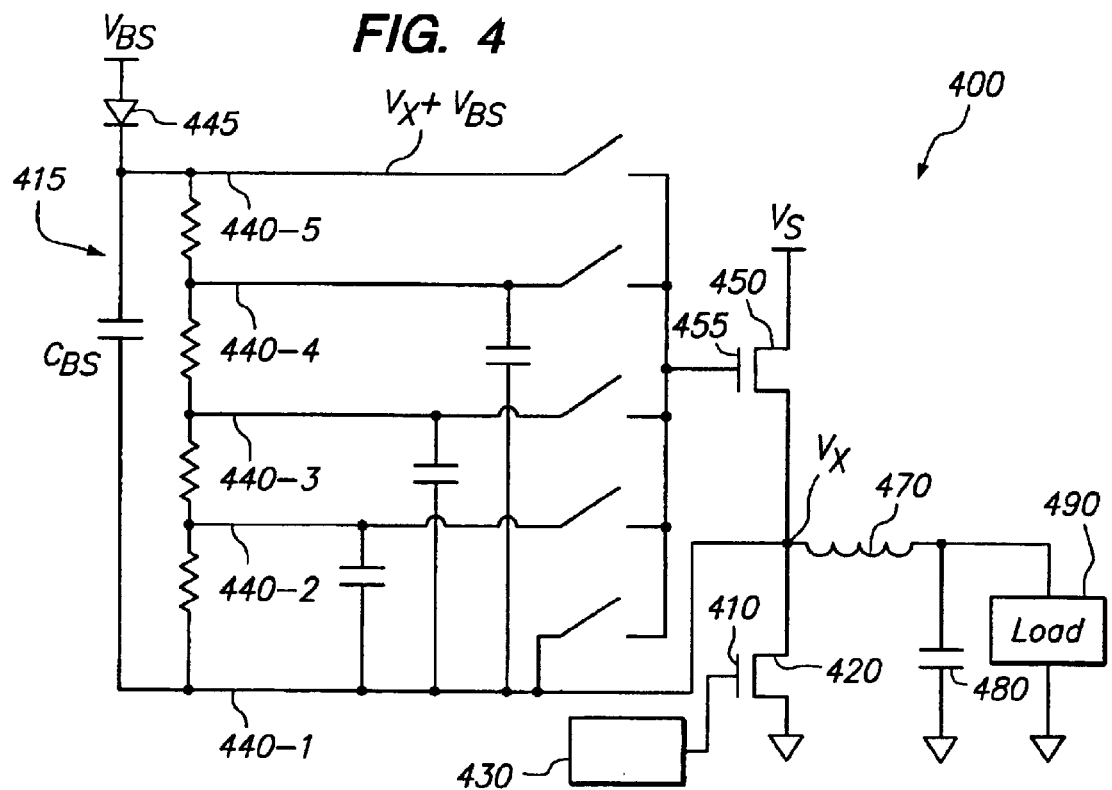
FIG. 4 is a schematic of another implementation of a DC/DC converter.

FIG. 4 shows a system 400, in which a first transistor 420 and a second transistor 450 are both implemented as NMOS transistors. A first multi-level controller 430 selectively communicates N different voltage levels with gate 410 of first transistor 420, while a second multi-level controller 415 selectively communicates M different voltage levels with gate 455 of second transistor 450.

In the example shown in FIG. 4, M is equal to five. Second multi-level controller 415 selectively applies voltage levels 440-1 through 440-5 to gate 455. For this implementation, voltage level 440-1 is equal to the voltage $V_x$ at the drains of first transistor 420 and second transistor 450. A node corresponding to voltage level 440-5 is connected to a bootstrap voltage $V_{BS}$ via a diode 445, and thus, for an ideal diode, voltage level 440-5 is equal to $V_x + V_{BS}$. The node corresponding to voltage level 440-5 is connected to a node corresponding to voltage level 440-1 via a bootstrap capacitor with capacitance equal to $C_{BS}$.

FIG. 4 shows a resistive voltage divider that determines the intermediate voltage levels. When each of the resistances in the voltage divider are equal, voltage level 440-2 is equal to $\frac{1}{4}(V_x + V_{BS})$, voltage level 440-3 is equal to $\frac{1}{2}(V_x + V_{BS})$, and voltage level 440-4 is equal to $\frac{3}{4}(V_x + V_{BS})$. As noted above with respect to FIG. 3A, other configurations may be used to provide the different voltage levels.

The systems and techniques described herein may provide additional advantages. For example, when first switch 210 and second switch 220 of FIG. 2 are implemented as transistors (as in FIGS. 3A, 3B, and 4), selectively applying a number of different voltages rather than directly switching the transistor on and off may reduce transistor stress, and thus decrease the mean time to failure of the associated transistors.

Figure 5A:
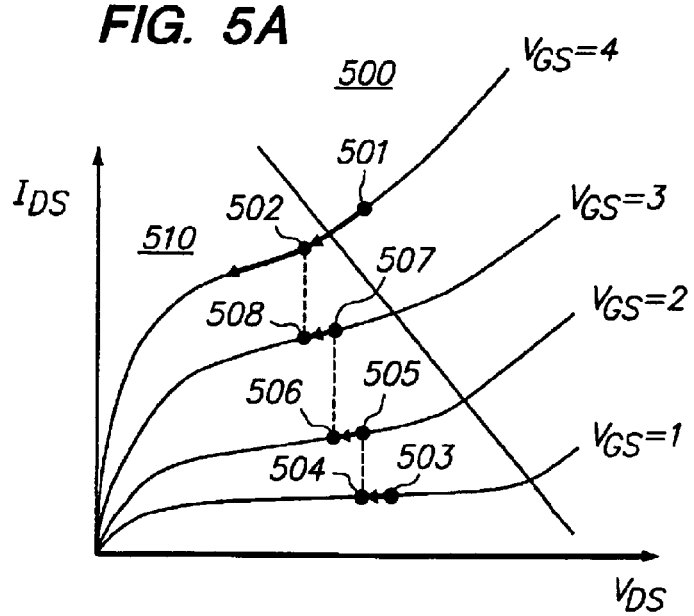
FIG. 5A is a plot of $I_{DS}$ versus $V_{DS}$ for different values of $V_{GS}$.

FIG. 5A shows a plot of the drain-source current $I_{DS}$ versus drain-source voltage $V_{DS}$ for different values of the gate source voltage $V_{GS}$. In a higher stress region 500 of FIG. 5A corresponding to high values of $V_{GS}$ and $V_{DS}$, the transistor experiences stress and may begin to break down. Repeated and/or prolonged periods of high transistor stress may shorten the lifetime of the transistor.

Switching the gate voltage directly from a voltage at which the transistor is off ($V_{off}$) to a voltage at which the transistor is fully on ($V_{on}$) may place the transistor in higher stress region 500 of FIG. 5A. For example, just after the gate voltage is switched from $V_{off}$ to $V_{on}$, both $V_{DS}$ and $V_{GS}$ may be high, and the transistor may be operating at $V_{DS}$ and $V_{GS}$ corresponding to point 501 in higher stress region 500. $V_{DS}$ decreases as the region under the gate is depleted of majority carriers and an inversion layer is created. After a time, $V_{DS}$ and $V_{GS}$ correspond to a point 502 in lower stress region 510. Generally, the longer the time spent in higher stress region 500, the greater the impact on transistor lifetime.

By selectively applying one or more intermediate voltage levels to the gate rather than directly switching the voltage between $V_{on}$ and $V_{off}$ (e.g., using the systems described above and illustrated in FIGS. 3A, 3B, and 4), $V_{GS}$ and $V_{DS}$ may remain in lower stress region 510 of FIG. 5A. For example, a transistor may be turned on by selectively applying intermediate voltage levels corresponding to those shown in FIG. 5A. The voltage may first be increased from $V_{off}$ to the first intermediate voltage level with $V_{GS}=1$. Just after the voltage is changed, $V_{GS}$ and $V_{DS}$ correspond to a point 503 in lower stress region 510 of FIG. 5A. Depletion of the majority carriers in the region under the gate begins, and the drain source voltage decreases, so that the transistor is operating at a point 504.

The voltage may then be increased from $V_{GS}=1$ to $V_{GS}=2$. Just after the voltage is changed, the transistor is operating at a point 505, which is still in lower stress region 510. $V_{DS}$ continues to decrease, until the transistor is operating at a point 506. Similarly, just after the gate voltage is increased from $V_{GS}=2$ to $V_{GS}=3$, the transistor is operating at a point 507, then at a point 508 corresponding to a lower value of $V_{DS}$. Finally, just after the gate voltage is increased from $V_{GS}=3$ to $V_{GS}=4$ ($V_{on}$), the transistor is operating at point 502 in lower stress region 510, and follows the curve to lower levels of $V_{DS}$ as shown.

For the turn-on process described above, each of the points 502–508 are in lower stress region 510 rather than higher stress region 500. Thus, selectively applying intermediate voltage levels to the gate may reduce or eliminate the time the transistor is operating in higher stress region 500.

Figure 5B:
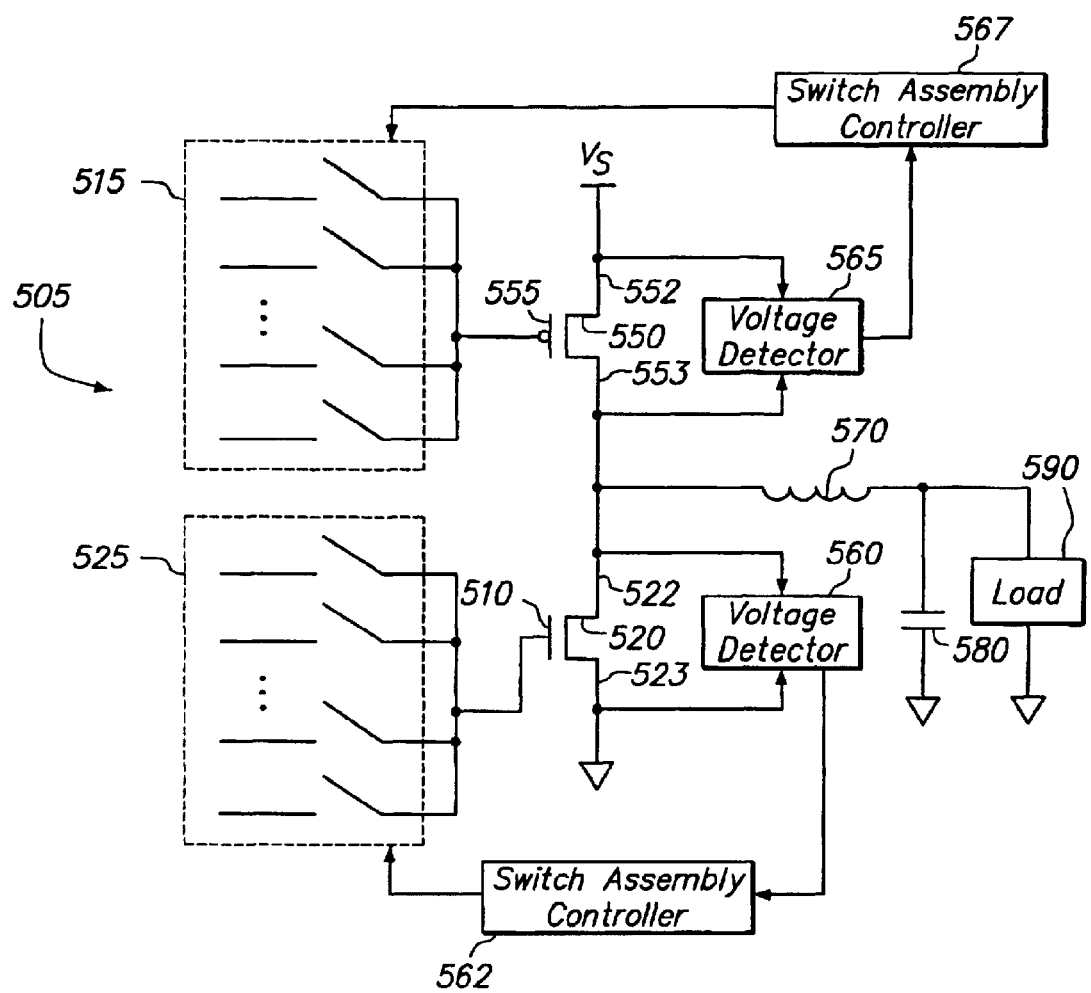
FIG. 5B is a schematic of an implementation of a DC/DC converter including a switch assembly controller.

In some implementations, a switch assembly controller may be provided to control the timing of the voltage changes so that high stress conditions may be avoided. Providing a switch assembly controller may allow the switching to be accomplished in a minimum time compatible with a particular stress threshold. FIG. 5B shows a system 505 including such a switch assembly controller. System 505 includes a first transistor switch 520 that may be turned on and off by selectively applying different voltage levels to a gate 510. For example, a multi-level connector 525 (which may be part of a multi-level controller) may selectively apply different voltages to gate 510.

System 505 includes a second transistor switch 550 that may be turned on and off by selectively applying different voltage levels to a gate 555 using a multi-level connector 515. A voltage detector 560 in communication with a drain 522 of first transistor 520 and a source 523 of first transistor 520 measures the source/drain voltage $V_{DS}$. Similarly, a voltage detector 565 may measure $V_{DS}$ for second switch 550. The output of voltage detector 560 may be provided to a switch assembly controller 562.

In order to turn on first switch 520, the gate voltage may be changed from a first voltage at which first switch 520 is off to a first intermediate voltage level. Voltage detector 560 outputs $V_{DS}$ to switch assembly controller 562. Switch assembly controller 562 may compare a measured value of $V_{DS}$ provided by voltage detector 560 with a threshold value $V_{DS}$(threshold). When the measured value of $V_{DS}$ is below $V_{DS}$(threshold), switch assembly controller 562 may provide a signal to multi-level connector 525 to change the voltage at gate 510 from the first intermediate voltage level to a second intermediate voltage level. The process may be repeated until the voltage level at gate 510 is sufficient to fully turn on first switch 520. A similar process may be used to turn second switch 550 off and on, using voltage detector 565 and a switch assembly controller 567. Note that although separate voltage detectors and switch assembly controllers are shown in FIG. 5B, they need not be separate.

Figure 6:
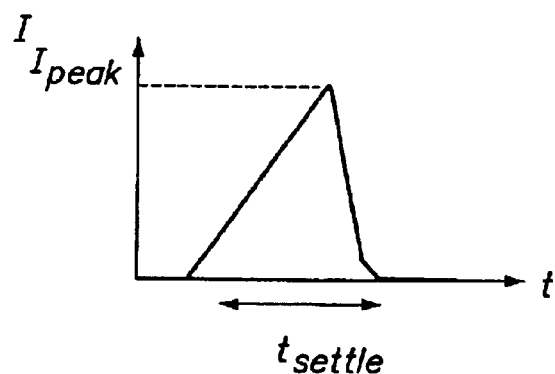
FIG. 6 is a plot of current as a function of time for a single transistor implementation.

As noted above, if the gate voltage does not completely settle to an applied intermediate voltage level prior to switching to the next level, the actual improvement in gate loss may be less than the theoretical level. However, using a single multi-level controller/transistor system may require impractically long settling times. FIG. 6 shows the relationship of the current flow from one of the storage capacitors to the gate of the power transistor. The current exhibits both a large peak and a long settling time.

Figure 7:
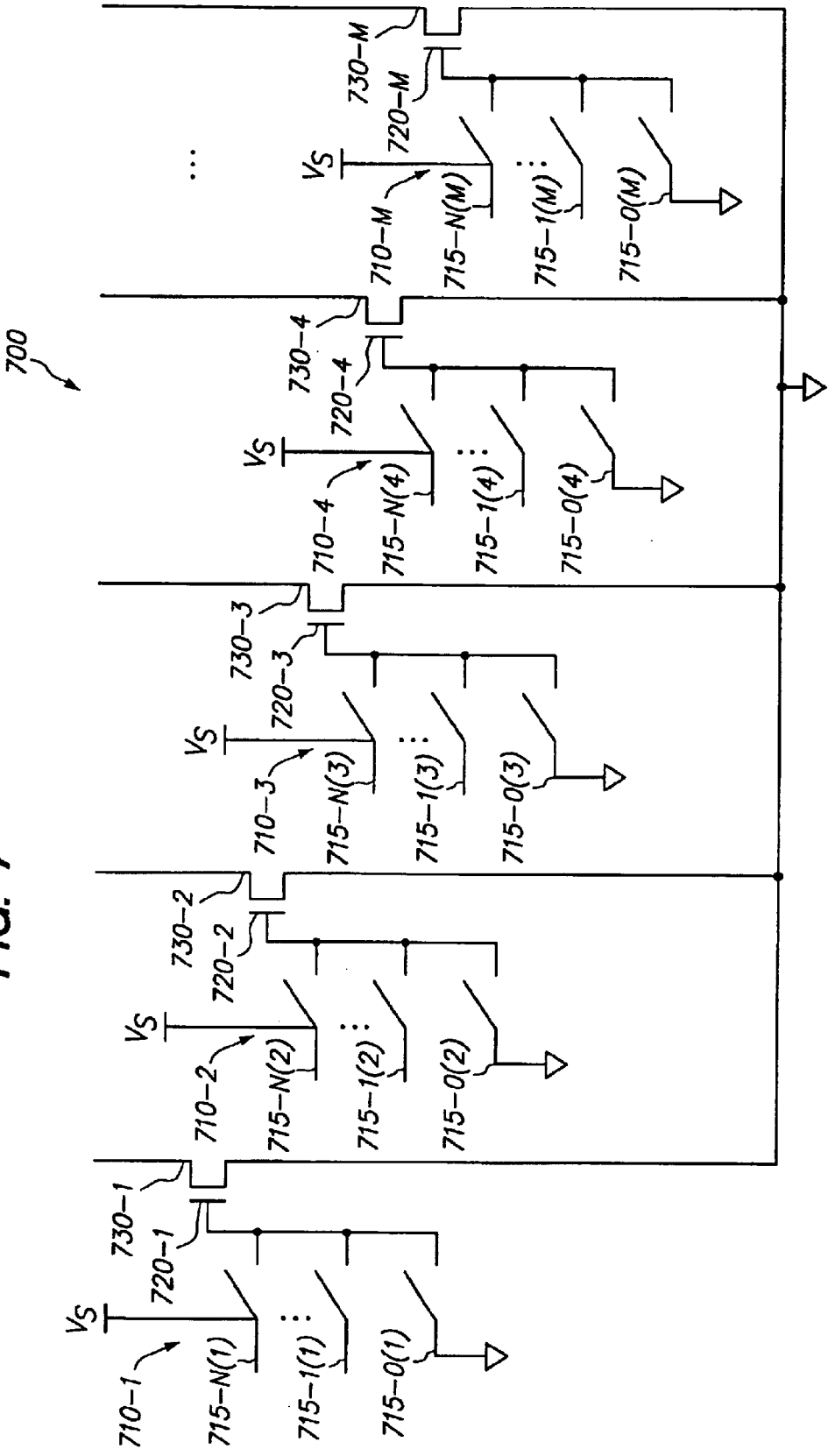
FIG. 7 is a schematic of an implementation including M transistors.

FIG. 7 shows an implementation of a system 700 that provides for both smaller current peaks and smaller settling times. Rather than a single multi-level controller/transistor system, a number of systems are used. That is, M multi-level controllers 710-1 through 710-M are each in communication with a gate 720-1 to 720-M of a switching transistor 730-1 to 730-M. In some implementations, each of the controllers 710-1 through 710-M selectively apply different voltage levels sequentially. For example, controller 710-1 selectively applies voltage levels 715-0(1) through 715-N(1) sequentially, while controller 710-2 selectively applies voltage levels 715-0(2) through 715-N(2) sequentially. The number and/or magnitude of the voltage levels may be the same for each controller or may be different.

M may be chosen to provide desired switching times and peak currents. In some implementations, M may be chosen to be between about 10 and about 1000. By sequentially applying different voltages using the controllers 710-1 through 710-M, transistors 730-1 to 730-M may be turned on and off more quickly without introducing a large transient current on the supply voltage of a PWM output stage.

Figure 8:
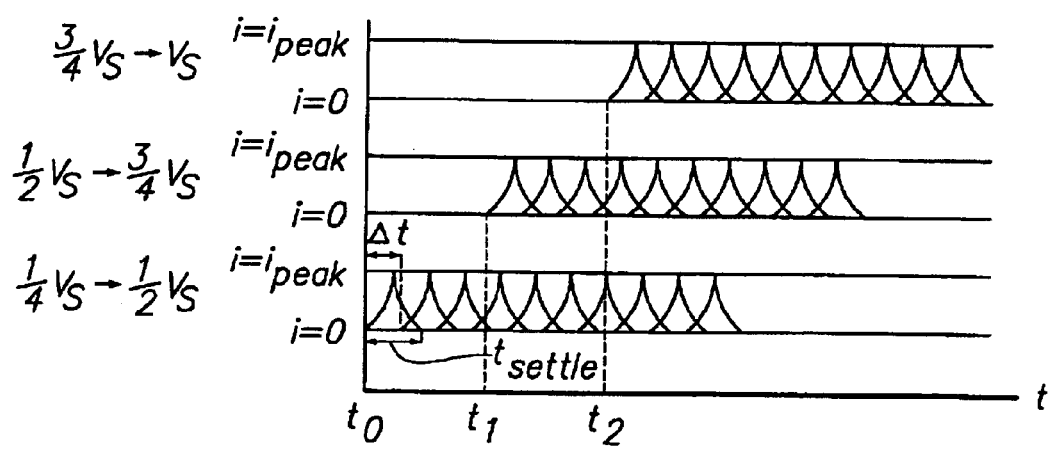
FIG. 8 is a plot of current versus time for an implementation using multiple transistors.

For an example where M=10 and N=4 in a system such as system 700, FIG. 8 shows the current flowing between the charge storage devices and the associated gates of the transistors being switched from ¼$V_s$ to $V_s$ through ½ $V_s$ and ¾ $V_s$. At $t_0$, the voltage applied via controller 710-1 is switched from ¼ $V_S$ to ½ $V_S$. After a time interval Δt, which may be less than the settling time of the first transistor as shown, the voltage applied via controller 710-2 is switched from ¼ $V_S$ to ½ $V_S$. The voltages applied via controllers 710-3 through 710-10 are subsequently switched from ¼ $V_S$ to ½ $V_S$. Since each transistor 730-1 through 730-10 is relatively small, the settling time $t_{settle}$ as well as the peak current $i_{peak}$ for each is substantially less than in the case where a single large transistor is used.

At a time $t_1$, the voltage applied via controller 710-1 is switched from ½ $V_S$ to ¾ $V_S$. The interval ($t_1-t_0$) may be either less than the time required to switch the voltage applied via all controllers 710-1 to 710-10 to ½ $V_S$ (as shown in FIG. 8), or may be the same as or greater than the time required to switch the voltage applied via all of the controllers. The voltage applied via the remaining controllers may then be switched from ½ $V_S$ to ¾ $V_S$. Similarly, at a time $t_2$, the voltage applied via controller 710-1 is switched from ¾ $V_S$ to $V_S$, with the voltage applied via the remaining controllers 710-2 through 710-10 being subsequently switched from ¾ $V_S$ to $V_S$.

Although the times used may vary, in some implementations, Δt may be on the order of about fifty picoseconds, ($t_1-t_0$) may be on the order of about half a nanosecond, and the transition from the high voltage to the low voltage (or vice versa) may be on the order of about five nanoseconds.

Figure 9:
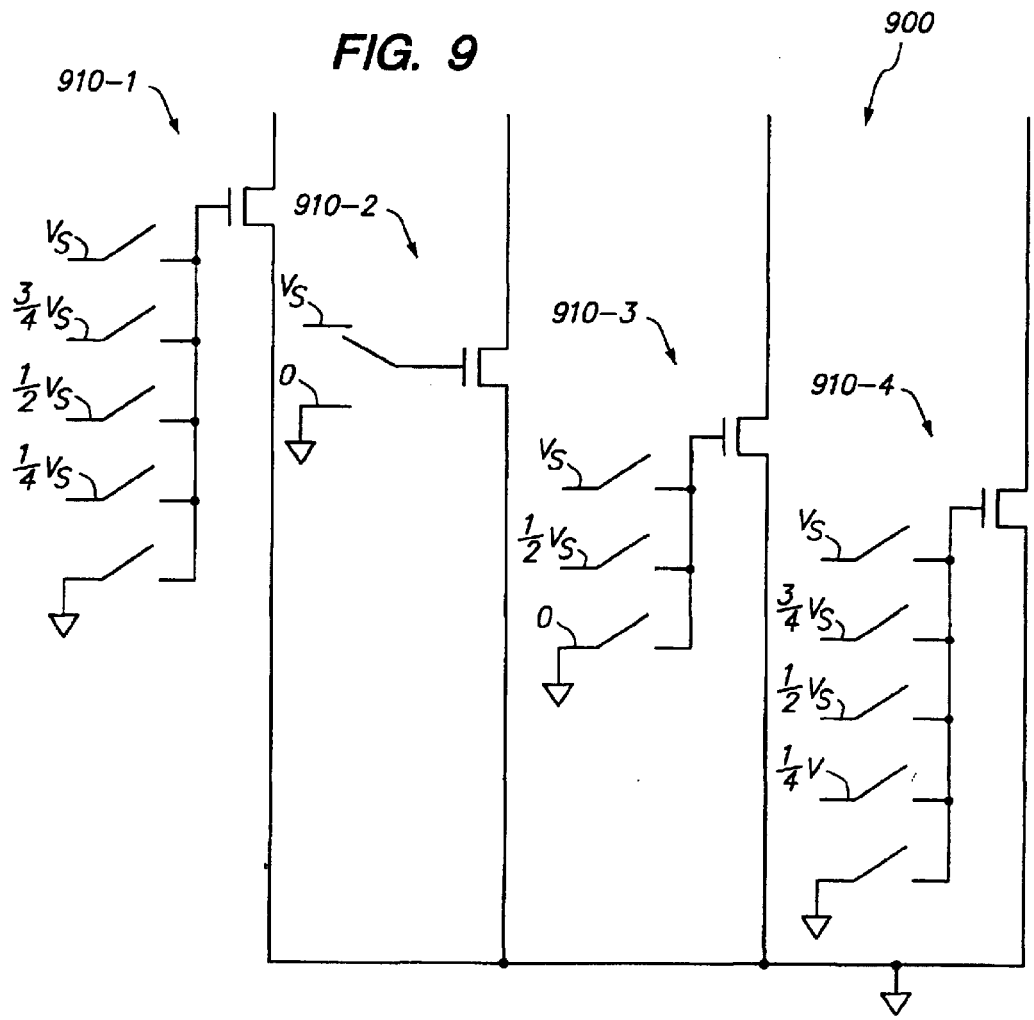
FIG. 9 is a schematic of an implementation including some controllers that are not switched through all intermediate voltage levels.

In some implementations, the voltage applied via some of the controllers may be stepped through fewer than all of the N voltage levels, or directly between the on voltage and the off voltage. This may reduce the time spent in transition between the high and low voltage levels. FIG. 9 shows an implementation where multi-level controllers 910-1 and 910-4 are switched from a low voltage level of 0 volts through three intermediate voltage levels (¼ $V_S$, ½ $V_S$, and ¾ $V_S$) to a high voltage $V_S$.

Rather than selectively applying all of the intermediate voltage levels, the voltage applied via a controller 910-2 is switched directly from the low voltage (in this example, 0 V) to the high voltage $V_S$. The voltage applied via a controller 910-3 is switched through a single intermediate voltage level of ½ $V_S$. Although the structure of controllers 910-2 and 910-3 are shown as different than the structure of controllers 910-1 and 910-4 in FIG. 9, in some implementations each controller may have the same structure. In such an implementation, the sequence of voltage levels applied via particular controllers may be implemented using, for example, software.

Quicker response time may be obtained by reducing the time in the transition between turning off the first switch and turning on the second switch (the "dead time"). The dead time may be reduced by overlapping the transition between switches.

In an example, the first switch may be an NMOS transistor and the second switch may be a PMOS transistor. Prior to turning on the PMOS transistor, the voltage applied to the gate of the NMOS transistor is stepped from $V_{on(N)}$ through the intermediate voltage levels to $V_{off(N)}$. In order to reduce the dead time, the process of turning on the PMOS transistor may be initiated before the voltage applied to the gate of the NMOS transistor is $V_{off(N)}$. For example, the voltage applied to the gate of the PMOS transistor may be changed from $V_{off(P)}$ to the first intermediate voltage level at a time when the voltage applied to the gate of the NMOS transistor is at an intermediate voltage level rather than at $V_{off(N)}$.

Since the PMOS transistor is barely on, the risk of large crowbar current generation during transition between devices is substantially reduced. In some implementations, the values of the lowest voltage level(s) may be chosen to facilitate this transition.

Figure 10:
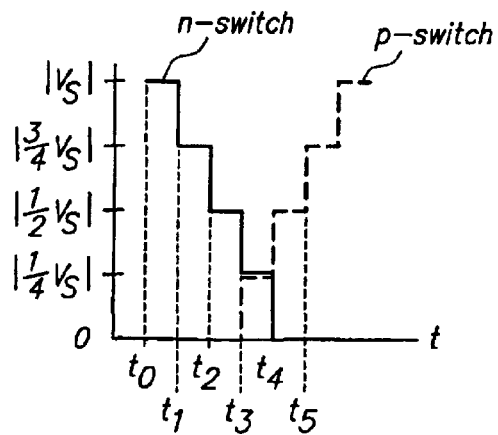
FIG. 10 is a plot of voltage versus time for an implementation in which there is some overlap in a transition between transistors.

FIG. 10 illustrates this process. For this example, the NMOS transistor is on at time $t_0$, with an applied voltage equal to $V_S$. At time $t_1$, the voltage to the gate of the NMOS transistor is reduced from $V_S$ to ¾ $V_S$. At time $t_2$, the voltage is reduced from ¾ $V_S$ to ½ $V_S$.

At time $t_3$, the voltage to the gate of the NMOS transistor is reduced from ½ $V_S$ to ¼ $V_S$. At about the same time, the voltage to the gate of the PMOS transistor is decreased from $V_{off(P)}$ to the first intermediate level (here, from 0 V to about −¼ $V_S$). Thus, the dead time may be reduced by an amount about equal to the settling time.

A number of implementations have been described. Nevertheless, it will be understood that various modifications may be made without departing from the spirit and scope of the invention. For example, although buck configurations have been shown herein for illustration, the described systems and techniques may be used with other implementations of DC/DC converters. Accordingly, other embodiments are within the scope of the following claims.

What is claimed is:

1. A direct current to direct current converter, comprising:
a first switch, the first switch to output a first voltage on a first output terminal in response to a turn-on voltage at a first control terminal, wherein the first control terminal selectively communicates with one of N>2 different voltages; and
a second switch, the second switch to output a second voltage on a second output terminal in communication with the first output terminal in response to a turn-on voltage at a second control terminal, wherein the second control terminal selectively communicates with one of M>1 different voltages.

2. The converter of claim 1, wherein M is greater than two.

3. The converter of claim 1, wherein the first output terminal and the second output terminal are in communication with a load.

4. The converter of claim 3, wherein the first output terminal and the second output terminal are in communication with the load via an inductor and a capacitor.

5. The converter of claim 1, wherein the first switch comprises a first transistor, the first output terminal comprises a drain of the first transistor, and the first control terminal comprises a gate of the first transistor.

6. The converter of claim 1, further including N voltage sources each supplying one of the N different voltages.

7. The converter of claim 1, wherein the first switch comprises a transistor having a source and a drain, and further comprising a voltage detector to detect a potential difference between the source and the drain.

8. The converter of claim 7, further including a switch assembly controller responsive to the voltage detector and further in communication with the first control terminal, and wherein the first control terminal selectively communicates with the one of the N>2 different voltages in accordance with the switch assembly controller.

9. The converter of claim 1, further including a first multi-level controller in communication with the first control terminal, the first multi-level controller including N drivers, each of the n=1 to n=N drivers to selectively apply a different voltage $V_n$ of the N different voltages to the first control terminal.

10. The converter of claim 9, further including a second multi-level controller in communication with the second control terminal, the second multi-level controller including M drivers, each of the m=1 to m=M drivers to selectively apply a different voltage $V_m$ of the M different voltages to the second control terminal.

11. The converter of claim 10, wherein the first multi-level controller and the second multi-level controller are to turn on the first switch and the second switch alternately.

12. The converter of claim 9, wherein the first multi-level controller comprises a switching mechanism to selectively communicate the N>2 different applied voltages with the first control terminal.

13. The converter of claim 9, wherein at least one of the N drivers comprises an associated capacitance.

14. The converter of claim 13, wherein at least a portion of the first multi-level controller is included in an integrated circuit, and wherein an associated capacitance of at least one of the N drivers includes a capacitance of a capacitor not included in the integrated circuit.

15. The converter of claim 14, wherein the first switch comprises a transistor with a gate and a source having an associated capacitance $C_{gs}$, and wherein the capacitance of the capacitor not included in the integrated circuit is larger than $C_{gs}$.

16. The converter of claim 9, wherein the first switch comprises a PMOS transistor, wherein the first control terminal is a gate of the PMOS transistor, and wherein the N drivers comprise three drivers to selectively apply a voltage $V_1$ at which the PMOS transistor is off, a voltage $V_3$ at which the PMOS transistor is on, and an intermediate voltage $V_2$ between $V_1$ and $V_3$.

17. The converter of claim 16, wherein $V_1$ is about equal to negative five volts or less, and wherein $V_3$ is ground.

18. The converter of claim 16, wherein the N drivers further comprise a fourth driver to selectively apply another intermediate voltage $V_4$, and wherein $V_4$ is between $V_1$ and $V_3$.

19. The converter of claim 9, wherein the first switch comprises an NMOS transistor, wherein the first control terminal is a gate of the NMOS transistor, and wherein the N drivers comprise three drivers to selectively apply a voltage $V_1$ at which the NMOS transistor is on, a voltage $V_3$ at which the NMOS transistor is off, and an intermediate voltage $V_2$ between $V_1$ and $V_3$.

20. The converter of claim 19, wherein $V_1$ is equal to about five volts or greater, and wherein $V_3$ ground.

21. The converter of claim 19, wherein the N drivers further comprise a fourth driver to selectively apply another intermediate voltage $V_4$, and wherein $V_4$ is between $V_1$ and $V_3$.

22. The converter of claim 9, wherein the N drivers are to selectively apply the different voltage $V_n$ for a time sufficient for the voltage at the first control terminal to substantially equilibrate with $V_n$.

23. The converter of claim 1, wherein the first control terminal selectively communicates with one of N>2 different voltages sequentially.

24. A direct current to direct current converter, comprising:
   an integrated circuit, the integrated circuit including:
      a first switch, the first switch to output a first voltage on a first output terminal in response to a turn-on voltage at a first control terminal;
      a second switch, the second switch to output a second voltage on a second output terminal in communication with the first output terminal in response to a turn-on voltage at a second control terminal; and
      a first multi-level controller in communication with the first control terminal, the first multi-level controller including N drivers, each of the n=1 to n=N drivers to selectively apply a different voltage $V_n$ to the first control terminal, where N is greater than two, and wherein at least one of the N drivers comprises an associated capacitance; and
   a capacitor separate from the integrated circuit, a capacitance of the capacitor included in the associated capacitance of one of the N drivers.

25. The converter of claim 24, wherein the capacitor is one of P capacitors, and wherein a capacitance of each of the P capacitors is included in the associated capacitance of at least one of the N drivers.

26. The converter of claim 25, wherein P is less than N.

27. The converter of claim 25, wherein P is greater than or equal to N.

28. The converter of claim 24, wherein the integrated circuit further comprises a second multi-level controller in communication with the second control terminal, the second multi-level controller including M drivers, each of the m=1 to m=M drivers to selectively apply a different voltage $V_m$ to the second control terminal, where M is greater than two.

29. The controller of claim 24, wherein the first switch comprises a first transistor, the first control terminal comprises a gate of the first transistor, and wherein a first driver is to selectively apply a voltage $V_1$ to the gate of the first transistor sufficient to turn on the transistor, to selectively apply a voltage $V_3$ to the gate of the first transistor sufficient to turn off the transistor, and to selectively apply a voltage $V_2$ between $V_1$ and $V_3$ to the gate of the first transistor.

30. The converter of claim 24, wherein the associated capacitance of the one of the N drivers further includes an on-chip capacitance of one or more elements of the integrated circuit.

31. The converter of claim 24, wherein the first multi-level controller includes the N drivers configured such that each of the n=N drivers selectively and sequentially applies a different voltage $V_n$ to the first control terminal.

32. A direct current to direct current converter, comprising:
   a first switching assembly, the first switching assembly including I switches, each of the I switches to output a voltage on an associated output terminal in response to a turn-on voltage at an associated control terminal, each of the associated output terminals in communication with a first switching assembly output terminal configured to output a voltage to a load, one or more of the I switches further including an associated multi-level controller in communication with an associated control terminal, an i-th one of the associated multi-level controllers including N(i) drivers, each of the n(i)=1 to n(i)=N(i) drivers to selectively apply a different voltage $V_{n(i)}$ to the associated control terminal, where N(i) is greater than two for at least one of the I switches.

33. The converter of claim 32, wherein each of the I switches includes an associated multi-level controller in communication with the associated control terminal.

34. The converter of claim 32, wherein N(i) is the same for each of the associated multi-level controllers.

35. The converter of claim 32, wherein N(i) is different for at least some of the associated multi-level controllers.

36. The converter of claim 32, further comprising:
   a second switching assembly, the second switching assembly including J switches, each of the J switches to output a voltage on an associated output terminal in response to a turn-on voltage at an associated control terminal, each of the associated output terminals in communication with a second switching assembly output terminal in communication with the first switching assembly output terminal, one or more of the J switches further including an associated multi-level controller in communication with an associated control terminal, a j-th one of the associated multi-level controllers including N(j) drivers, each of the n(j)=1 to n(j)=N(j) drivers to selectively apply a different voltage $V_{n(j)}$ to the associated control terminal, where N(j) is greater than two for at least one of the J switches.

37. The converter of claim 32, wherein the I switches comprise I transistors, and wherein the associated control terminal comprises a gate of the associated transistor.

38. The converter of claim 32, wherein the i-th one of the associated multi-level controllers includes the N(i) drivers configured such that each of the n(i)=1 to n(i)=N(i) drivers selectively and sequentially applies a different voltage $V_{n(i)}$ to the associated control terminal.

39. A method of direct current to direct current power conversion, the method comprising:
   alternately generating a first output voltage at an output of a first switching assembly including I switches and generating a second output voltage at an output of a second switching assembly including J switches, the output of the first switching assembly in communication with the output of the second switching assembly, wherein generating the first output voltage comprises turning on the first switching assembly, and wherein turning on the first switching assembly comprises:
   selectively applying n(i)=1 to n(i)=N(i) different voltages $V_{n(i)}$ to an associated control terminal of an i-th one of the I switches, wherein selectively applying the different voltages $V_{n(i)}$ comprises applying a voltage $V_{1(i)}$ at which the i-th switch is off, subsequently applying an intermediate voltage $V_{int(i)}$, and subsequently applying a voltage $V_{N(i)}$ at which the i-th switch is on, wherein $V_{int(i)}$ is between $V_{1(i)}$ and $V_{N(i)}$.

40. The method of claim 39, wherein turning on the first switching assembly comprises selectively applying a voltage $V_{2(i)}=V_2$ in turn to a plurality of the I switches and applying a voltage $V_{3(i)}=V_3$ to the plurality of the I switches.

41. The method of claim 40, wherein selectively applying the voltage $V_2$ in turn to the plurality of the I switches and applying the voltage $V_3$ to the plurality of the I switches comprises applying the voltage $V_3$ to at least one of the plurality of I switches and applying the voltage $V_2$ to a different one of the plurality of I switches at the same time.

42. The method of claim 40, wherein selectively applying the voltage $V_2$ in turn to the plurality of the I switches comprises applying the voltage $V_2$ to each of the i=1 to i=I switches sequentially, and wherein applying the voltage $V_3$ to the plurality of the I switches comprises applying the voltage $V_3$ to each of the I switches sequentially, and wherein applying the voltage $V_3$ to at least one of the plurality of I switches and applying the voltage $V_2$ to a different one of the plurality of I switches at the same time comprises applying the voltage $V_3$ to the i=1 switch prior to applying the voltage $V_2$ to the i=I switch.

43. The method of claim 39, wherein generating the second output voltage comprises turning on the second switching assembly, and wherein turning on the second switching assembly comprises:

selectively applying m(j)=1 to m(j)=M(j) different voltages $V_{m(j)}$ to an associated control terminal of a j-th one of the J switches, wherein selectively applying the different voltages $V_{m(j)}$ comprises applying a voltage $V_{1(j)}$ at which the j-th switch is off, subsequently applying an intermediate voltage $V_{int(j)}$, and subsequently applying a voltage $V_{M(j)}$ at which the j-th switch is on, wherein $V_{int(j)}$ is between $V_{1(j)}$ and $V_{M(j)}$; and wherein alternately generating the first output voltage at the output of the first switching assembly and generating the second output voltage at the output of the second switching assembly comprises turning on the first switching assembly while selectively applying a voltage $V_{off(j)}$ to each of the j=1 to j=J switches, where $V_{off(j)}$ is a voltage at which the respective j-th switch is off.

44. The method of claim 39, wherein generating the second output voltage comprises turning on the second switching assembly, and wherein turning on the second switching assembly comprises:

selectively applying m(j)=1 to m(j)=M(j) different voltages $V_{m(j)}$ to an associated control terminal of a j-th one of the J switches, wherein selectively applying the different voltages $V_{m(j)}$ comprises applying a voltage $V_{1(j)}$ at which the j-th switch is off, subsequently applying an intermediate voltage $V_{int(j)}$, and subsequently applying a voltage $V_{M(j)}$ at which the j-th switch is on, wherein $V_{int(j)}$ is between $V_{1(j)}$ and $V_{M(j)}$; and wherein alternately generating the first output voltage at the output of the first switching assembly and generating the second output voltage at the output of the second switching assembly comprises turning on the first switching assembly while selectively applying a voltage different than $V_{1(j)}$ to at least one of the j=1 to j=J switches.

45. The method of claim 44, wherein the voltage different than $V_1(j)$ is $V_2(j)$.

46. The method of claim 36, wherein $V_{2(j)}$ is a voltage at which the respective at least one of the j=1 to j=J switches is barely on.

47. The method of claim 39, wherein generating the second output voltage comprises turning on the second switching assembly, and wherein turning on the second switching assembly comprises:

selectively applying m(j)=1 to m(j)=M(j) different voltages $V_{m(j)}$ to an associated control terminal of a j-th one of the J switches, wherein selectively applying the different voltages $V_{m(j)}$ comprises applying a voltage $V_{1(j)}$ at which the j-th switch is off, subsequently applying an intermediate voltage $V_{int(j)}$, and subsequently applying a voltage $V_{M(j)}$ at which the j-th switch is on, wherein $V_{int(j)}$ is between $V_{1(j)}$ and $V_{M(j)}$.

48. The method of claim 39, further comprising filtering the first output voltage and the second output voltage to produce a generally direct current voltage.

49. The method of claim 48, further comprising applying the generally direct current voltage to a load.

50. A direct current to direct current converter, comprising:

a first switching means, the first switching means for outputting a first voltage on a first output terminal means in response to a turn-on voltage at a first control terminal means, wherein the first control terminal means selectively communicates with one of N>2 different voltages; and a second switching means, the second switch for outputting a second voltage on a second output terminal means in communication with the first output terminal means in response to a turn-on voltage at a second control terminal means, wherein the second control terminal means selectively communicates with one of M>1 different voltages.

51. The converter of claim 50, wherein the first output terminal means and the second output terminal means are in communication with a load.

52. The converter of claim 51, wherein the first output terminal means and the second output terminal means are in communication with the load via an inductor and a capacitor.

53. The converter of claim 50, wherein the first switching means comprises a first transistor, the first output terminal means comprises a drain of the first transistor, and the first control terminal means comprises a gate of the first transistor.

54. The converter of claim 50, further including a means for supplying each of the N different voltages.

55. The converter of claim 50, wherein the first switching means comprises a transistor having a source and a drain, and further comprising a voltage detection means for detecting a potential difference between the source and the drain.

56. The converter of claim 55, further including a switch assembly controlling means in communication with the voltage detection means and further in communication with the first control terminal means, the switch assembly controlling means for comparing the potential difference between the source and the drain with a threshold potential difference, the switch assembly controlling means further for causing the first control terminal means to selectively communicate with a different one of the N>2 different voltages if the potential difference between the source and the drain is less than the threshold potential difference.

57. The converter of claim 50, further including a first multi-level controlling means for controlling the first switching means, the first multi-level controlling means in communication with the first control terminal, the first multi-level controlling means including N driving means, each of the n=1 to n=N driving means for selectively applying a different voltage $V_n$ of the N different voltages to the first control terminal means.

58. The converter of claim 57, further including a second multi-level controlling means for controlling the second switching means, the second multi-level controlling means in communication with the second control terminal means, the second multi-level controlling means including M driving means, each of the m=1 to m=M driving means for selectively applying a different voltage $V_m$ of the M different voltages to the second control terminal means.

59. The converter of claim 58, wherein the first multi-level controlling means and the second multi-level controlling means are for turning on the first switching means and the second switching means alternately.

60. The converter of claim 57, wherein the first multi-level controlling means comprises a switching means for selectively communicating the N>2 different applied voltages with the first control terminal means.

61. The converter of claim 57, wherein at least one of the N driving means comprises an associated capacitance.

62. The converter of claim 61, wherein at least a portion of the first multi-level controlling means is included in an integrated circuit, and wherein an associated capacitance of at least one of the N driving means includes a capacitance of a capacitor not included in the integrated circuit.

63. The converter of claim 62, wherein the first switching means comprises a transistor with a gate and a source having an associated capacitance $C_{gs}$, and wherein the capacitance of the capacitor not included in the integrated circuit is larger than $C_{gs}$.

64. The converter of claim 57, wherein the first switching means comprises a PMOS transistor, wherein the first control terminal means is a gate of the PMOS transistor, and wherein the N driving means comprise three driving means for selectively applying a voltage $V_1$ at which the PMOS transistor is off, a voltage $V_3$ at which the PMOS transistor is on, and an intermediate voltage $V_2$ between $V_1$ and $V_3$.

65. The converter of claim 64, wherein $V_1$ is about equal to negative five volts or less, and wherein $V_3$ is ground.

66. The converter of claim 64, wherein the N driving means further comprise a fourth driving means for selectively applying another intermediate voltage $V_4$, and wherein $V_4$ is between $V_1$ and $V_3$.

67. The converter of claim 57, wherein the first switching means comprises an NMOS transistor, wherein the first control terminal means is a gate of the NMOS transistor, and wherein the N driving means comprise three driving means for selectively applying a voltage $V_1$ at which the NMOS transistor is on, a voltage $V_3$ at which the NMOS transistor is off, and an intermediate voltage $V_2$ between $V_1$ and $V_3$.

68. The converter of claim 67, wherein $V_1$ is equal to about five volts or greater, and wherein $V_3$ ground.

69. The converter of claim 67, wherein the N driving means further comprise a fourth driving means for selectively applying another intermediate voltage $V_4$, and wherein $V_4$ is between $V_1$ and $V_3$.

70. The converter of claim 57, wherein the N driving means are for selectively applying the different voltage $V_n$ for a time sufficient for the voltage at the first control terminal means to substantially equilibrate with $V_n$.

71. The converter of claim 50, wherein M is greater than two.

72. The converter of claim 50, wherein the first control terminal means selectively and sequentially communicates with one of N>2 different voltages.

73. A direct current to direct current converter, comprising:
an integrated circuit, the integrated circuit including:
a first switching means, the first switching means for outputting a first voltage on a first output terminal means in response to a turn-on voltage at a first control terminal means;
a second switching means, the second switching means for outputting a second voltage on a second output terminal means in communication with the first output terminal means in response to a turn-on voltage at a second control terminal means; and
a first multi-level controlling means for controlling the first switching means, the first multi-level controlling means in communication with the first control terminal means, the first multi-level controlling means including N driving means, each of the n=1 to n=N driving means for selectively applying a different voltage $V_n$ to the first control terminal means, where N is greater than two, and wherein at least one of the N driving means comprises an associated capacitance means; and
a second capacitance means separate from the integrated circuit, a capacitance of the second capacitance means included in the associated capacitance means of one of the N driving means.

74. The converter of claim 73, wherein the associated capacitance means of the one of the N driving means further includes an on-chip capacitance of one or more elements of the integrated circuit.

75. The converter of claim 73, wherein the n=1 to n=N driving means comprises n=1 to n=N driving means for selectively and sequentially applying a different voltage $V_n$ to the first control terminal means.

76. The converter of claim 73, wherein the integrated circuit further comprises a second multi-level controlling means for controlling the second switching means, the second multi-level controlling means in communication with the second control terminal means, the second multi-level controlling means including M driving means, each of the m=1 to m=M driving means for selectively applying a different voltage $V_m$ to the second control terminal means, where M is greater than two.

77. The controller of claim 73, wherein the first switching means comprises a first transistor, the first control terminal means comprises a gate of the first transistor, and wherein a first driving means is for selectively applying a voltage $V_1$ to the gate of the first transistor sufficient to turn on the transistor, for selectively applying a voltage $V_3$ to the gate of the first transistor sufficient to turn off the transistor, and for selectively applying a voltage $V_2$ between $V_1$ and $V_3$ to the gate of the first transistor.

78. The converter of claim 73, wherein the second capacitance means includes one of P capacitors, and wherein a capacitance of each of the P capacitors is included in the associated capacitance means of at least one of the N driving means.

79. The converter of claim 78, wherein P is less than N.

80. The converter of claim 78, wherein P is greater than or equal to N.

81. A direct current to direct current converter, comprising:
a first switching assembly means, the first switching assembly means including I switching means, each of the I switching means for outputting a voltage on an associated output terminal means in response to a turn-on voltage at an associated control terminal means, each of the associated output terminal means in communication with a first switching assembly means output terminal means configured to output a voltage to a load, one or more of the I switching means further including an associated multi-level controlling means for controlling the switching means, the associated multi-level controlling means in communication with an associated control terminal means, an i-th one of the associated multi-level controlling means including N(i) driving means, each of the n(i)=1 to n(i)=N(i) driving means for selectively applying a different voltage $V_{n(i)}$ to the associated control terminal means, where N(i) is greater than two for at least one of the I switching means.

82. The converter of claim 81, wherein N(i) is the same for each of the associated multi-level controlling means.

83. The converter of claim 81 wherein N(i) is different for at least some of the associated multi-level controlling means.

84. The converter of claim 81, wherein the n(i)=1 to n(i)=N(i) driving means comprises n(i)=1 to n(i)=N(i) driving means for selectively and sequentially applying a different voltage $V_{n(i)}$ to the associated control terminal means.

85. The converter of claim 81, further comprising:
a second switching assembly means, the second switching assembly means including J switching means, each of the J switching means to output a voltage on an associated output terminal means in response to a turn-on voltage at an associated control terminal means, each of the associated output terminal means in communication with a second switching assembly means output terminal means in communication with the first switching assembly means output terminal means, one or more of the J switching means further including an associated multi-level controlling means for controlling the switching means, the associated multi-level controlling means in communication with an associated control terminal means, a j-th one of the associated multi-level controlling means including N(j) driving means, each of the n(j)=1 to n(j)=N(j) driving means for selectively applying a different voltage $V_{n(j)}$ to the associated control terminal means, where N(j) is greater than two for at least one of the J switches.

86. The converter of claim 81, wherein the I switching means comprise I transistors, and wherein the associated control terminal means comprises a gate of the associated transistor.

87. The converter of claim 81, wherein each of the I switching means includes an associated multi-level controlling means in communication with the associated control terminal means.

88. A direct current to direct current converter, comprising:
means for generating a first output voltage at a node of the direct current to direct current converter;
means for generating a second output voltage alternately with the first output voltage at the node;
wherein the means for generating the first output voltage comprises:
means for selectively applying n=1 to n=N(i) different voltages to a control terminal of an i-th one of I switches, wherein the different voltages include a voltage $V_{1i}$ at which the associated i-th switch is off, a voltage $V_{N(i)i}$ at which the associated i-th switch is on, and a voltage $V_{int(i)}$ between $V_{1i}$ and $V_{N(i)i}$.

89. The converter of claim 88, wherein the means for generating the first output voltage comprises:
means for selectively applying m=1 to m=M(j) different voltages to a control terminal of a j-th one of J switches, wherein the different voltages include a voltage $V_{1j}$ at which the associated j-th switch is off, a voltage $V_{M(j)j}$ at which the associated j-th switch is on, and $V_{int(j)}$ between $V_{1j}$ and $V_{M(j)j}$.

90. The converter of claim 88, wherein the means for selectively applying comprises means for selectively and sequentially applying the n=1 to n=N(i) different voltages to the control terminal of the i-th one of the I switches.

* * * * *